United States Patent [19]

Pschunder

[11] 3,802,924

[45] Apr. 9, 1974

[54] THIN SOLAR CELL WITH RIM AND METAL CONTACT ON REVERSE FACE

[75] Inventor: Willi Pschunder, Pleidelsheim, Germany

[73] Assignee: Licentia Patent-Verwaltungs-G.m.b.H., Frankfurt/Main, Germany

[22] Filed: Mar. 21, 1972

[21] Appl. No.: 236,717

[30] Foreign Application Priority Data

Mar. 30, 1971 Germany .......................... 2115305

[52] U.S. Cl. .................................. 136/206, 136/89
[51] Int. Cl. .......................................... H01l 15/02
[58] Field of Search .............................. 136/89, 206

[56] References Cited

UNITED STATES PATENTS

| | | | |
|---|---|---|---|
| 3,421,943 | 1/1969 | Shaikh et al. | 136/89 |
| 2,911,539 | 11/1959 | Tanenbaum | 136/89 UX |
| 3,483,038 | 12/1969 | Hui et al. | 136/89 |
| 3,597,281 | 8/1971 | Webb | 136/206 |
| 3,490,950 | 1/1970 | Myer | 136/89 |
| 3,278,337 | 10/1966 | Gault | 136/89 |

OTHER PUBLICATIONS

Gereth et al., "Silicon Solar Cell Technology of the Seventies," 8th IEEE Photovoltaic Specialists Conference, pp. 353–359, Aug. 1970.

*Primary Examiner*—Carl D. Quarforth
*Assistant Examiner*—E. A. Miller
*Attorney, Agent, or Firm*—Spencer & Kaye

[57] ABSTRACT

A solar cell comprises a semiconductor body with a p-n junction extending parallel to the front face of the cell and a recess in the reverse face of the cell surrounded by rim portions which are narrow as compared to the dimensions of the recess.

5 Claims, 1 Drawing Figure

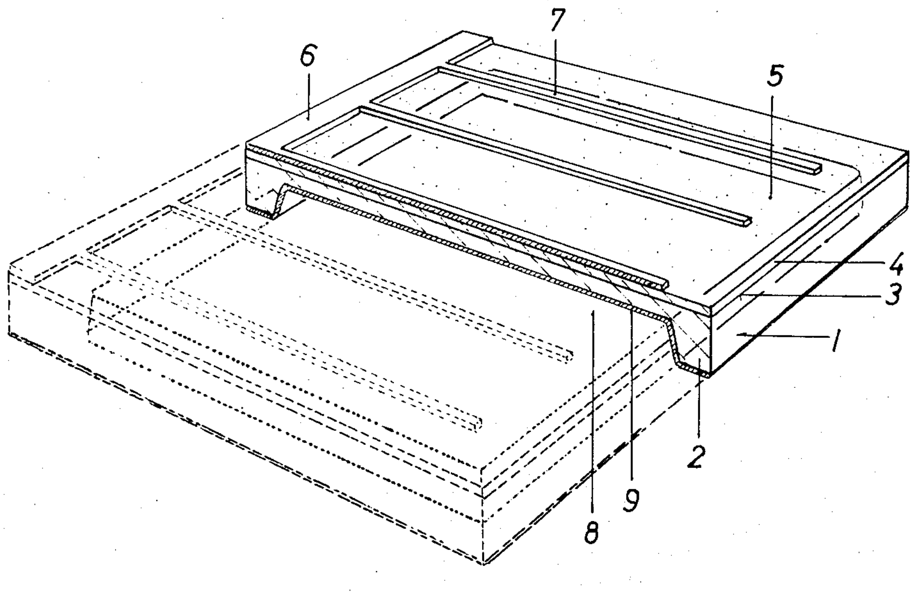
7
6
5
4
3
1
2
9
8

THIN SOLAR CELL WITH RIM AND METAL CONTACT ON REVERSE FACE

BACKGROUND OF THE INVENTION

The invention relates to a solar cell with a *p–n* junction mounted parallel to the front face of the cell adapted to receive the radiation.

Solar cells are used for transforming radiation energy into electrical energy. The incident photons are absorbed in the semiconductor body where they produce charge carriers by forming pairs which diffuse to the *p–n* junction and make possible a delivery of electrical power by the cell.

Generally, solar cells consist of square, rectangular or round semiconductor plates with a thickness of about 300 μm. Solar cells, consisting usually of silicon, are used mainly for the supply of energy for satellites and space vehicles, a plurality of individual cells being connected together to form a solar cell battery. In space vehicles, the weight of the solar cells is a critical factor, because every increase in the weight of the space vehicle necessarily entails a substantial increase in the starting and fuel mass of the rocket. Thus, in solar cells, the term "power/weight ratio" is used, and this is defined as the quotient of output and weight.

However, the thickness of solar cells cannot be reduced infinitely, because the semiconductor materials used are very brittle and the semiconductor cells break easily. The manufacture of extremely thin cells, the assembly of these cells to form a solar battery and the mounting of these batteries in a space vehicle are difficult and expensive. Generally, the semiconductor plates are reduced to the final thickness by sawing, etching and lapping. The lower limit for a still acceptable, economical manufacture is a residual thickness of the order of about 200 μm.

SUMMARY OF THE INVENTION

It is an object of the invention to provide a solar cell having an increased power to weight ratio.

According to the invention, there is provided a solar cell including a semiconductor body, a *p–n* junction extending in the semiconductor body parallel to a front face of the semiconductor body which is adapted to receive radiation and rim portions disposed on a reverse face of the semiconductor body opposite to the front face, defining a recess in the reverse face of the semiconductor body and being narrower than the dimensions of the recess.

BRIEF DESCRIPTION OF THE DRAWING

The invention will now be described in greater detail, by way of example, with reference to the drawing, the single FIGURE of which shows a solar cell according to the invention partly in perspective and partly in cross-section.

DESCRIPTION OF THE PREFERRED EMBODIMENT

Basically, in order to increase the power/weight ratio of solar cells beyond the present value, the invention proposes in solar cells of the type described above, that the solar cells are provided with a recess on the reverse face, wherein the remaining thicker rim portions are narrow, compared with the dimensions of the remaining thinner zones of the recess.

Thus, the solar cells according to the invention have a U-shaped cross-section.

Since the major part of the light incident on the solar cells is absorbed within a region of thickness about 100 μm from the surface, the cell has in the recess a thickness of preferably about 100 μm, while the rim of the cell has a thickness of about 200 – 300 μm.

Referring now to the drawing, there is shown a solar cell according to the invention, partly in perspective and partly in cross-section. The dotted lines complete the cell after the manner of a phantom drawing.

The silicon solar cell 1, has, for example, a rectangular configuration as shown. The dimensions are generally 2 × 2 cm, 2 × 4 cm, 3 × 4 cm or 2 × 6 cm. Obviously, plates of other geometrical configurations, e.g., circular discs, also may be used.

A *p–n* junction 3, extending parallel to the front surface 5, which is adapted to receive the radiation, is arranged at a distance of a few tenths μm below this surface. For example, the thin surface region 4 may have a *n*-type conductivity, while the remaining part of the semiconductor plate has *p*-type conductivity. The front side of the cell carries a comb-like contact, consisting of a side web 6 with narrow, strip webs 7 extending perpendicularly therefrom, which collect current from the surface. The reverse side of the cell has a recess 8 which forms the major part of the cross-section of the cell. In this recess, the cell has a thickness of about 100 μm, while the remaining rim portions 2 have a thickness of about 200 – 300 μm. The thicker, frame-like rim 2 may have a thickness of, e.g., 1 – 2 mm.

The reverse of the cell is covered with a metal contact 9, which extends over the whole reverse side, including the recess.

Several solar cells are connected together to form a battery, for example, by connecting, in the region of the thicker rim, the contact on the reverse side of one solar cell with the front side contact of a next solar cell. For this purpose, strip-shaped connecting contacts of silver may be used, for example.

The solar cell according to the invention provides good electrical properties along with good mechanical strength and a minimum weight. The connection between the cells is made at a point, where the cells have a thickness of 200 – 300 μm. The high pressure which may occur during the welding of the cells, does not result in damage to the cell due to the strength of the cells.

With large area solar cells, the frame-like thicker rim is preferably reinforced by intermediate webs with the same thickness so that the reverse face has several recesses, separated from each other by intermediate webs.

What is claimed is:

1. A solar cell comprising: a semiconductor body having front and reverse faces; a *p–n* junction spaced at a first distance from said front face of said semiconductor body, extending in said semiconductor body parallel to said front face of said semiconductor body and adapted to receive radiation; rim portions on said reverse face of said semiconductor body opposite to said front face, defining a recess on said reverse face of said semiconductor body, which recess is spaced from said front face of said semiconductor body by a distance greater than the first distance, and said rim portions having a width substantially narrower than the width of said recess; and, a metal contact applied to the entire area of said reverse face of said semiconductor body including said rim portions and said recess.

2. A solar cell as defined in claim 1, wherein said semiconductor body has a thickness between front and reverse faces in said recess of about 100 $\mu$m and at said rim portions of 200 to 300 $\mu$m.

3. A solar cell as defined in claim 2, wherein said rim portions have a width of about 1 to 2 mm.

4. A solar cell as defined in claim 1 wherein said rim portions include intermediate web portions and edge portions defining a plurality of recesses in said reverse face of said semiconductor body.

5. A solar battery including a plurality of solar cells, said solar cells each comprising: a semiconductor body having front and reverse faces; a *p–n* junction spaced at a first distance from said front face of said semiconductor body, extending in said semiconductor body parallel to said front face of said semiconductor body and adapted to receive radiation; rim portions on said reverse face of said semiconductor body opposite to said front face, defining a recess in said reverse face of said semiconductor body, which recess is spaced from said front face of said semiconductor body by a distance greater than the first distance, and said rim portion having a width substantially narrower than the width of said recess, a first metal contact on said front face of said semiconductor body and a second metal contact on the entire area of said reverse face of said semiconductor body including said rim portions and said recess and connection means connecting said first metal contact of one solar cell at the rim of said one solar cell with said second metal contact of another solar cell at the rim of said another solar cell.

* * * * *